PROCESS FOR FORMING A P-N JUNCTION IN A SEMICONDUCTOR MATERIAL

Filed Nov. 5, 1969

INVENTOR.
BRYAN H. HILL
BY Harry A. Herbert Jr. and
Cedric H. Kuhn
ATTORNEYS

United States Patent Office 3,704,178

Patented Nov. 28, 1972

3,704,178
PROCESS FOR FORMING A P-N JUNCTION IN A SEMICONDUCTOR MATERIAL

Bryan H. Hill, Dayton, Ohio
(2525 Stewart Road, Xenia, Ohio 45385)

Filed Nov. 5, 1969, Ser. No. 874,196
Int. Cl. H01l 7/54
U.S. Cl. 148—1.5 6 Claims

ABSTRACT OF THE DISCLOSURE

A solid body of a first conductivity type has a passivating oxide layer formed on one of its surfaces; a mask having an opening therein is provided over the layer; the opening is exposed to ion radiation so as to implant ions in the oxide layer; and the solid body is heated, thereby driving ion dopants from the oxide layer into the body and providing a region therein having a conductivity opposite the first conductivity type.

Figure 1:
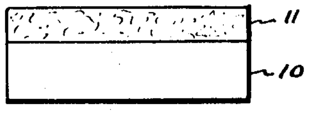

This invention relates to a process for the fabrication of semiconductor devices. In one aspect it relates to a process for forming a P-N junction in a semiconductor material.

The established method of producing semiconductor components or devices, such as transistors, diodes, and integrated circuits, involves diffusion techniques. A conventional diffusion method requires the provision of an oxide diffusion source from which ion dopants having a desired conductivity type are diffused into a semiconductor material by exposure to a high temperature. The techniques usually employed in providing oxide diffusion sources are electrochemical in nature and present many problems. For example, electrophoretic cells used in one method of providing a source require elaborate procedures to prepare and have a large number of variable parameters to control, such as concentration of impurity, current density, time of electrophoretic deposition and other wet chemistry problems. The preparation of diffusion sources by anodic oxidation also presents many wet chemistry problems.

A more recent development in the fabrication of semiconductor devices involves the use of an ion beam to implant ions in a semiconductor material. The use of an ion beam to implant ions offers a number of advantages over the diffusion method. For example, the ion beam provides better control of the depth of ion penetration and the concentration gradient of the dopant. And furthermore, of greatest importance from a processing standpoint, the ion beam implantation method is not subject to the wet chemistry problems of the diffusion techniques. However, since semiconductor devices prepared by thermal diffusion have different characteristics from devices fabricated by ion implantation, it may not be feasible to employ the latter method where it is desired to obtain a particular device.

It is an object of this invention, therefore, to provide a process for fabricating semiconductor components or devices that possess the advantages of the ion beam implantation method while obtaining a product having the characteristics of one obtainable by a thermal diffusion method.

A further object of the invention is to provide a process for forming a P-N junction in a semiconductor material.

Another object of the invention is to provide a process for fabricating semiconductor devices having NPN or PNP planar configurations.

Other and further objects and advantages of the invention will become apparent to those skilled in the art upon consideration of the accompanying disclosure and the drawing in which FIGS. 1 through 5 illustrate diagrammatically the various steps followed in producing a P-N junction according to the process of the invention.

Broadly speaking, the process of this invention comprises the steps of forming an oxide layer on a semiconductor body or substrate of a first conductivity type; forming a mask on the oxide layer, the mask having at least one opening therein to expose the oxide layer; bombarding the opening with ions of a selected conductivity opposite to the first conductivity type so as to implant ion dopants in the oxide layer; and heating the thus treated body to an elevated temperature that does not exceed the melting point of the semiconductor body. It has been found that by operating in the described manner many of the problems inherent in the thermal diffusion method are obviated while obtaining a product having the characteristics of one prepared by that method. The concept of using ion implantation to dope an oxide and thereby provide a diffusion source provides a wide range of surface concentrations and actually permits the solid solubility limit of impurities to be reached in many semiconductors. Since low energy ions are normally used in the practice of the process of this invention, damage to underlying layers is not normally caused by the ion implantation. However, in the event damage should result, the damage will be annealed out at the temperature used in the thermal diffusion step.

Referring now to FIG. 1 of the drawing, a substrate or a body 10, formed of a semiconductor material, has a passivating oxide layer 11 deposited or grown on one of its surfaces. The semiconductor body as illustrated is a P-type silicon although other materials, such as germanium and gallium arsenide, can be used. Furthermore, the semiconductor can be an N-type material, for example, an N-type silicon. The oxide layer, e.g., silicon dioxide can be deposited or grown on the surface of the body by any well-known procedure. For example, the oxide layer may be thermally grown on the surface of body 10 to a thickness of about 500 to 10,000, preferably 750 to 2000, angstroms.

Figure 2:
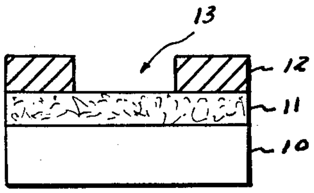

As shown in FIG. 2, the oxide layer has a masking material 12 disposed on its surface. A suitable masking material is known to the art as photoresist; however, other materials can be used such as gold, silver or platinum. The thickness of the mask is such as to prevent ions from penetrating through the mask. After application of the mask, it is treated so as to provide at least one opening 13 therein. While only a single opening is illustrated, it is to be understood that in fabricating a particular device or devices more than one opening may be created in the mask.

Figure 3:
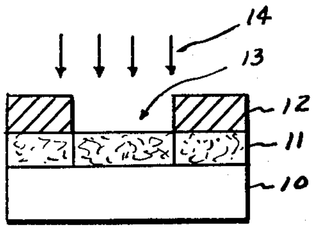

As seen from FIG. 3, the opening in mask 12 is bombarded with a beam of ions 14 from a suitable source. An ion source such as a plasma generator, commonly known in the art as an electron bombardment ion source, can be advantageously used to provide ions of a desired conductivity type. Assuming as before that body 10 is a P-type semiconductor as a result of containing P-type dopants such as gallium, aluminum, or indium, then the dopants implanted in the unmasked oxide layer 15 are of the N-type such as phosphorus, arsenic, antimony or boron. It is to be understood that body 10 can be an N-type semiconductor in which case P-type dopants are implanted in the oxide layer. The concentration and the depth of penetration of the ion implanted dopants in the oxide layer are controlled by adjusting such variables as beam current, time of implantation and beam energy. It is generally preferred to employ a low energy source of ions, thereby permitting the use of a thin oxide layer. For example, with a silicon dioxide layer having a thickness in the range of 750 to 2000 angstroms, an energy source of 15 to 35 kev. can be used to dope the oxide.

The use of a low energy source is also preferred since problems of high voltage, X-ray production, and large power supplies are obviated or substantially reduced. However, it is within the contemplation of the invention to use a high energy ion source, e.g., in the range of 60 to 150 kev., in which case a thicker oxide layer must be used.

Figure 4:
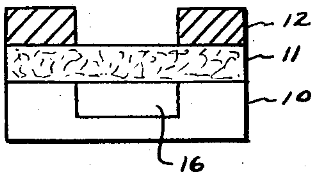
Figure 5:
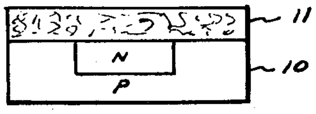

The semiconductor body having an N-type dopant implanted in the unmasked portion of its oxide layer is then placed in a suitable holder such as a quartz boat. The boat is then inserted into a furnace that is maintained at an elevated temperature below the melting point of the semiconductor material. In the case of silicon the temperature of the furnace is generally in the range of 900 to 1200° C. As a result of subjecting the semiconductor body to this thermal treatment, the N-type dopants in the oxide layer are diffused into the body. As shown in FIG. 4, there is formed a region 16 having an N-type conductivity. The photoresist mask is then removed by dissolving it in a suitable solvent, thereby providing a semiconductor having a P-N junction as shown in FIG. 5.

A better understanding of the invention can be obtained by referring to the following illustrative example which is not intended, however, to be unduly limitative of the invention.

EXAMPLE

A diode array with electrical or ohmic contacts is fabricated in accordance with the method of this invention. Initially, a silicon wafer having a P-type conductivity is exposed to an oxidizing atmosphere of steam at about 900° C. for fifty minutes. An oxide layer having a thickness of about 2000 A. is thereby produced on a surface of the wafer. A mask is formed on the oxide layer by first flashing chromium on the layer and then evaporating gold on the chromium. A photoresist of appropriate design for a diode is then placed on the gold by known photo techniques. The gold is then selectively etched through the photoresist, leaving a plurality of windows or openings therein to the oxide layer.

After creation of the openings, the wafer is bombarded with phosphorus ions of 35 kev. energy, thereby implanting the ion dopants in the exposed portions of the oxide layer. The wafer is then placed in a quartz boat which is inserted in a furnace maintained at 1150° C. As a result of this thermal treatment, the ion dopants are driven from the oxide layer into the wafer body, thereby converting regions of the body to N-type material with a P-N junction lying between these regions and the body.

The mask is removed from the wafer by washing with an acid after diffusion of the ions is completed. Thereafter, holes are opened in the oxide layer opposite the N-type regions by standard photoresist techniques and metal contacts are then deposited on the surface of the N-type regions. Suitable electrical wire may then be attached as by ball bonding to the contacts. The wafer may then be broken into separate diodes or may be broken into integrated circuits.

While the process of this invention has been described with a certain degree of particularity, it will be apparent to one skilled in the art after reading the disclosure that the process is generally applicable to the fabrication of semiconductor devices or components that are used in the manufacture of integrated circuits.

I claim:

1. A process for forming a P-N junction in a semiconductor material which comprises the steps of forming an oxide layer on a semiconductor substrate of a first conductivity type; forming a mask on said oxide layer; treating said mask so as to provide at least one opening therein to said oxide layer; bombarding said opening with ions of a selected conductivity opposite to said first conductivity so as to implant ion dopants only in said oxide layer; heating said substrate to an elevated temperature that is below the melting point of said semiconductor material, thereby driving said implanted ion dopants from said oxide layer into said substrate and forming at least one P-N junction; and removing the mask from said oxide layer.

2. A process according to claim 1 in which said substrate is silicon having a P-type conductivity and said ions are phosphorus ions of N-type conductivity.

3. A process according to claim 1 in which said substrate is silicon having a N-type conductivity and said ions are aluminum ions of P-type conductivity.

4. A process according to claim 2 in which said substrate is heated to a temperature in the range of 900 to 1200° C.

5. A process according to claim 1 in which said mask is treated so as to provide a plurality of openings therein; said openings are bombarded with said ions so as to implant ion dopants in portions of said oxide layer opposite said openings; and said substrate is heated to said elevated temperature, thereby forming a plurality of P-N junctions.

6. A process according to claim 1 in which a silicon dioxide layer having a thickness of 500 to 10,000 angstroms is formed on a silicon substrate and said opening is bombarded with ions from an energy source of 15 to 150 kev.

References Cited

UNITED STATES PATENTS

| | | | |
|---|---|---|---|
| 3,177,100 | 4/1965 | Mayer et al. | 148—175 |
| 3,513,364 | 5/1970 | Heiman | 148—1.5 |
| 3,328,210 | 6/1967 | McCaldin et al. | 148—1.5 |
| 3,481,776 | 12/1969 | Manchester | 148—1.5 |
| 3,457,632 | 7/1969 | Dolan et al. | 148—1.5 |
| 3,383,567 | 5/1968 | King et al. | 148—1.5 |
| 3,472,712 | 10/1969 | Bower | 148—187 |
| 3,434,894 | 3/1969 | Gale | 148—187 |
| 3,445,926 | 5/1969 | Medved et al. | 148—1.5 |
| 3,461,361 | 8/1969 | Delivorias | 148—1.5 |
| 3,523,042 | 8/1970 | Bower et al. | 148—1.5 |
| 3,607,449 | 9/1971 | Tokuyama et al. | 148—1.5 |

L. DEWAYNE RUTLEDGE, Primary Examiner

J. M. DAVIS, Assistant Examiner

U.S. Cl. X.R.

148—187, 188; 317—235 R